United States Patent [19]

Kurino et al.

[11] Patent Number: 5,613,296
[45] Date of Patent: Mar. 25, 1997

[54] METHOD FOR CONCURRENT FORMATION OF CONTACT AND VIA HOLES

[75] Inventors: Hiroyuki Kurino, Ushiku; Yasuhiro Ogata, Tsuchiura, both of Japan

[73] Assignee: Texas Instruments Incorporated, Dallas, Tex.

[21] Appl. No.: 420,997

[22] Filed: Apr. 13, 1995

[51] Int. Cl.$^6$ .................................................... H01K 3/10
[52] U.S. Cl. ................................ 29/852; 427/96; 174/261
[58] Field of Search ...................... 29/852, 853; 174/250, 174/261, 265; 427/96, 97

[56] References Cited

U.S. PATENT DOCUMENTS

| | | | |
|---|---|---|---|
| 5,061,438 | 10/1991 | Lillie et al. | 427/96 |
| 5,268,194 | 12/1993 | Kawakani et al. | 427/96 |

FOREIGN PATENT DOCUMENTS

| | | | |
|---|---|---|---|
| 4262373 | 9/1992 | Japan | 427/96 |

OTHER PUBLICATIONS

*IEEE*, Dixit et al., "A Novel High Pressure Low Temperature Aluminum Plug Technology For Sub–0.5 μm Contact/Via Geometries", pp. 5.3.1–5.3.4, 1994.

"Enhanced Bottom Coverage of Sub–Micron Contact Holes Using a Novel Hi–Fill Ti/TiN Sputter Process".

*Primary Examiner*—P. W. Echols
*Assistant Examiner*—Adrian L. Coley
*Attorney, Agent, or Firm*—William W. Holloway; Leo N. Heiting; Richard L. Donaldson

[57] ABSTRACT

In order to facilitate the fabrication of wiring layers in integrated circuit devices, the conductive path interconnections between areas of conduction on three layers, the three layers being separated by insulating layers, of the integrated circuit are fabricated during the same sequence of operations. The regions of conduction can be associated with the surface of a semiconductor substrate along with associated components fabricated thereon and two wiring layers, or the regions of conduction can be associated with three wiring layers. After the second insulating layer is formed, but before the formation of the final conductive layer, holes are created, a portion of the holes extending through the second insulating region to the prior wiring layer and a portion of the holes extending through the second insulting layer and through the first insulating layer to a semiconductor substrate or to an initial wiring layer. In order to provide a conductive plug for high aspect holes, a final conductive layer is formed, and pressure is applied thereto, forcing the conductive material into the holes. The conductive material remaining is patterned and etched to form a final wiring layer.

20 Claims, 6 Drawing Sheets

METHOD FOR CONCURRENT FORMATION OF CONTACT AND VIA HOLES

BACKGROUND OF THE INVENTION

1. Field of the Invention

This invention relates generally to a process for the fabrication of semiconductor devices and, more particularly, to the interconnection of multiple layers of conductive leads, the conductive leads electrically coupling the components of the integrated circuit.

2. Description of the Related Art

In the related art, contacts and vias are fabricated in integrated circuit devices and provide interconnections between various circuit components and the wiring layers, the wiring layers providing the conducting paths between the circuit components. Contacts connect a first wiring layer with the surface of the semiconductor substrate (and to the circuit elements located on the surface of the semiconductor substrate). Vias connect a second wiring layer through a second insulator layer to the first wiring layer. When it is necessary to connect the second wiring layer to the substrate, both a via and a contact are used. A conductive path (contact) is fabricated from the substrate through an insulating layer to the first wiring layer and a second conductive path (via) is fabricated from the first wiring layer through a second insulating layer to a second wiring layer.

Referring to FIG. 1, a typical integrated circuit device with a plurality of wiring layers is shown. A semiconductor substrate 10 includes components (illustrated by component 11) fabricated thereon. Conductive paths (contacts 13) extend through the first insulating layer 12 and are electrically coupled to the first wiring layer 14. A via 16 extends from the first wiring layer through a second insulating level 15 to a second wiring layer 17. The wiring layers are fabricated on the semiconductor substrate, according to the related art, with the following process steps.

Forming a metal inter-level oxide insulating layer

Patterning the contact holes on the insulating layer

Etching the contact holes

Forming the contact hole plug

Depositing a first conductive layer

Patterning the first conductive layer

Etching the first conductive layer to form the first wiring layer

Forming a second metal inter-level oxide insulating layer

Patterning the via holes on the insulating layer

Etching the via holes

Forming the via hole plugs

Depositing the second conductive layer

Patterning the second conductive layer

Etching the second conductive layer to form the second wiring layer

In this device fabrication process, the steps, wherein the contacts and the vias are formed, require careful and time consuming procedures. These procedures increase the cost and time required to fabricate these devices. One of the principal problems in the fabrication has been in the formation of the plugs, i.e., the material introduced into the contact and via holes to provide the conducting path. As the density of components has increased the dimensions of the integrated circuits have been reduced and the difficulties in insuring that a conducting path in the contact and via has been created by the plugging process have increased. In addition, the aspect ratio of the holes, i.e., the ratio of the depth to the width of the hole, has increased which, further increasing the difficulty of filling the holes and forming a acceptable conducting path. Recently, techniques have been developed which provide greater reliability for the fabrication of contacts and vias (cf. U.S. patent application Ser. No. (TI-20162) and assigned to the assignee of the present Patent Application; an article entitled ENHANCED BOTTOM COVERAGE OF SUB-MICRON CONTACT HOLES USING A NOVEL HI-FILL Ti/TiN SPUTTER-PROCESS; and an article entitled A NOVEL HIGH PRESSURE LOW TEMPERATURE ALUMINUM PLUG TECHNOLOGY FOR SUB-0.05 um CONTACT/VIA GEOMETRIES).

A need has therefore been felt for a technique by which the time required for the fabrication of an integrated circuit device having multiple wiring layers is reduced and in which the process for the formation of acceptable conductive paths between the wiring layers is improved.

SUMMARY OF THE INVENTION

The aforementioned and other features are accomplished, according to the present invention by a process for fabrication of an integrated circuit device having a plurality of wiring layers wherein three wiring layers or two wiring layers and a semiconductor device substrate are electrically coupled concurrently. After a first insulating layer is formed on a wiring layer or on the device, an intermediate wiring layer followed by a second insulating layer are formed thereon. Holes are then fabricated through the second insulating region which expose portions of the intermediate wiring layer. Other holes are fabricated through both the second insulating layer and the first insulating layer to expose portion of the first wiring layer or the semiconductor substrate. A conductive layer is then formed and the conductive material of the conductive layer is forced into the holes. The conducting layer is then patterned and etched to form a wiring layer, the newly formed wiring layer now having conductive paths to areas associated with two integrated circuit layers.

These and other features of the present invention will be understood upon the reading of the following description in conjunction with the Figures.

DESCRIPTION OF THE PREFERRED EMBODIMENT

1. Detailed Description of the Drawings

Figure 1:
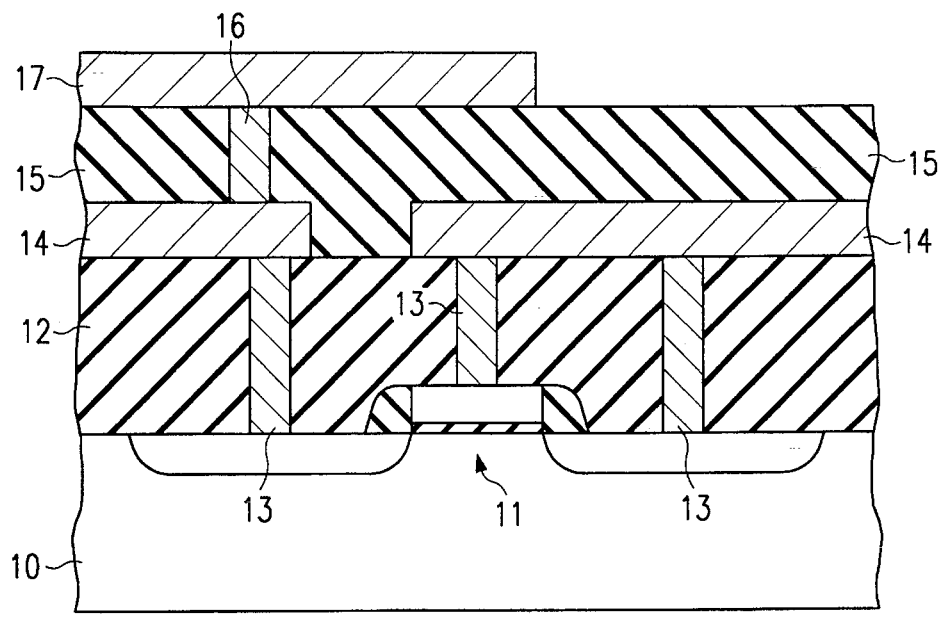
FIG. 1 is a cross-sectional view of the a two-wiring layer integrated circuit device fabricated by the techniques of the related art.

FIG. 1 has been described with respect to the related art.

Figure 2:
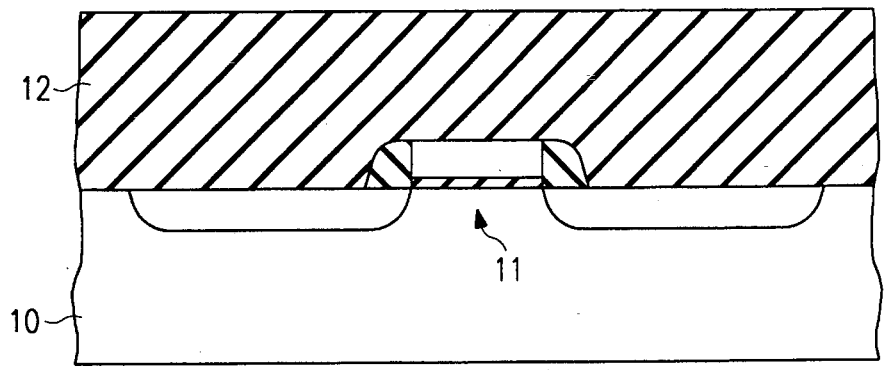
FIG. 2 is cross-sectional view of the result of the forming an first insulating layer step in the fabrication of a two-wiring layer integrated circuit device in accordance with the present invention.
Figure 3:
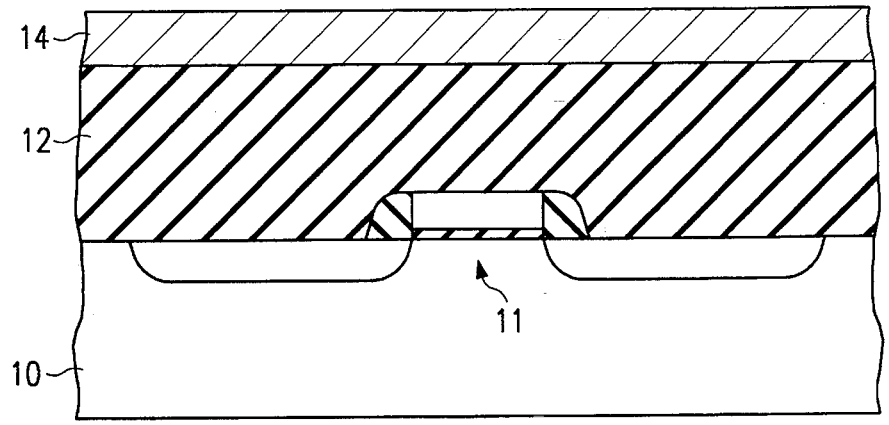
FIG. 3 is a cross-sectional view of the result of the forming of the first conductive layer in the fabrication of a two-wiring layer integrated circuit in accordance with the present invention.

Referring next to FIG. 2, a cross-sectional view of the first step in creating a multi-wiring layer integrated circuit is shown. This first step is the formation of a first insulating layer on the semiconductor substrate (and the components formed on the surface of the substrate. A conducting layer 14 is next deposited on the first insulating layer as shown in FIG. 3.

Figure 4:
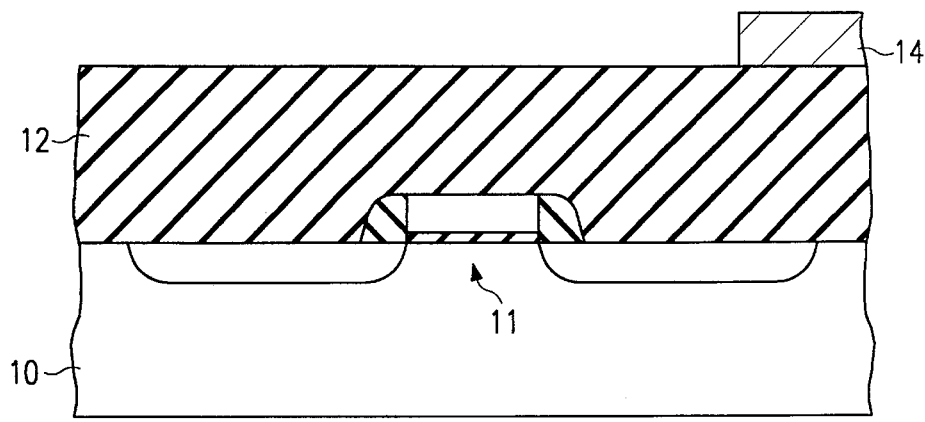
FIG. 4 is a cross-sectional view of the result of the forming patterning and etching steps on the first conductive layer to form a first wiring layer in the fabrication of a two-wiring layer integrated circuit in accordance with the present invention.
Figure 5:
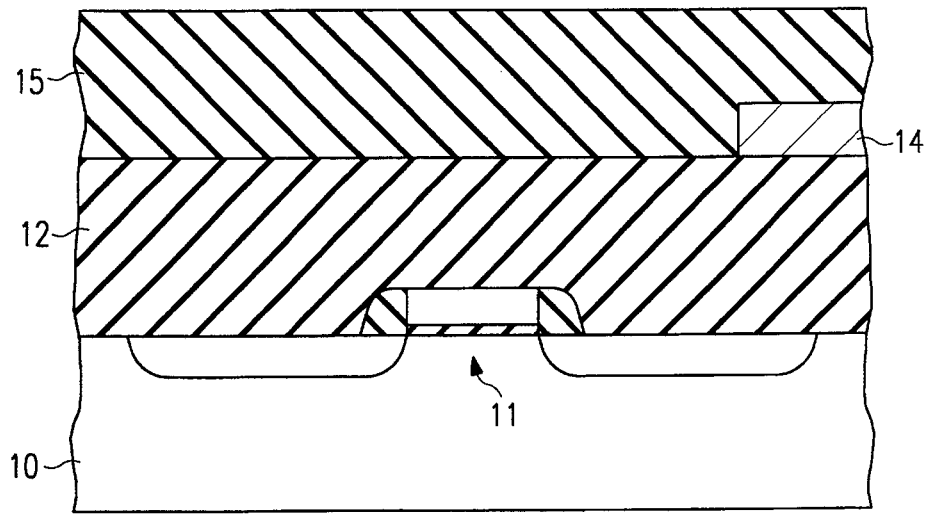
FIG. 5 is a cross-sectional view of the result of forming the second insulating layer step in the fabrication of a two-wiring layer integrated circuit in accordance with the present invention.

In FIG. 4, a cross-sectional view of the integrated circuit in which the conducting layer 14 has been etched and patterned to form a first wiring layer 14 is shown. A second insulating layer 15 is deposited on the exposed surface of the integrated circuit as shown in FIG. 5.

Figure 6:
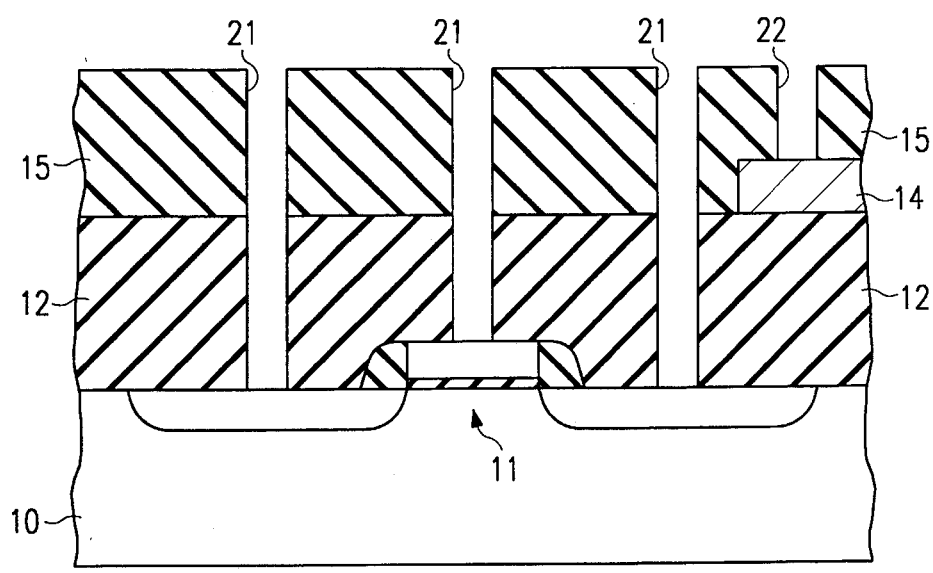
FIG. 6 is a cross-sectional view of the result of forming holes in the first and second insulating layers step in the fabrication of a two-wiring layer integrated circuit in accordance with the present invention.

In FIG. 6, the second insulating layer 15 is patterned and etched to provide holes 21 and 22. A portion of the holes (22) extend only through the second (i.e., top) insulating layer 15 to expose a surface of the first wiring layer 14; while the remainder of the holes extend through the second insulating layer 15 and the first insulating layer 12 to expose predetermined areas of the substrate 10 surface and components.

Figure 7:
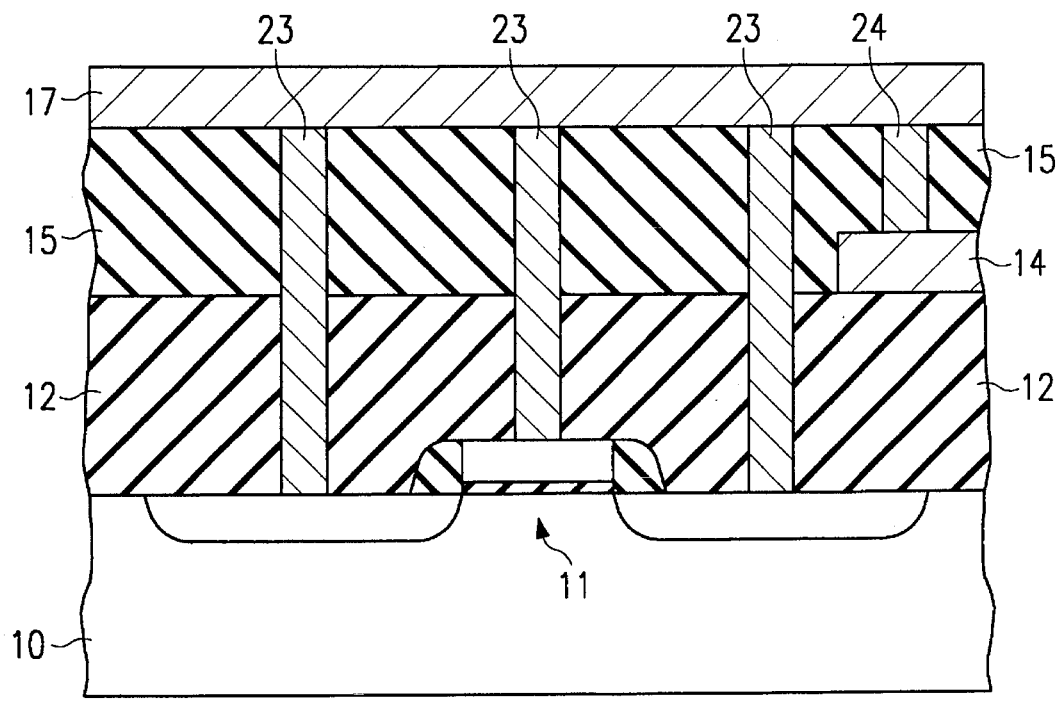
FIG. 7 is a cross-sectional view of the result of filling the holes with a conducting material and forming a second conducting layer in the fabrication of a two-wiring layer integrated circuit in accordance with the present invention.
Figure 8:
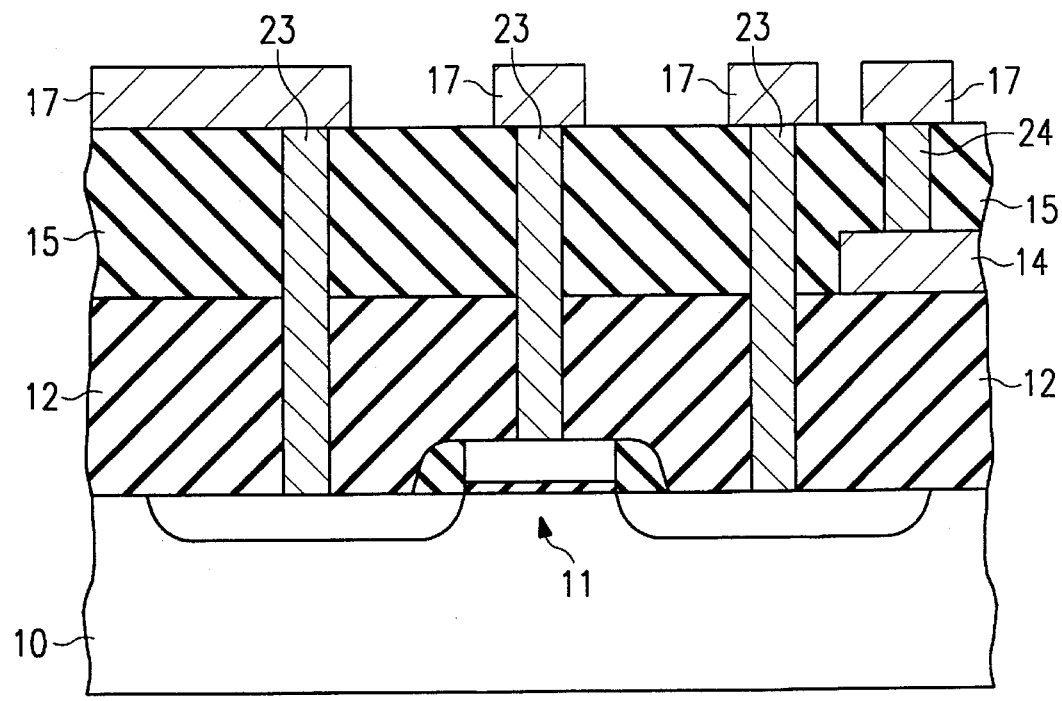
FIG. 8 is a cross-sectional view of the result of patterning and etching steps of the second conducting layer to form the second wiring layer in the fabrication of a two-wiring layer integrated circuit in accordance with the present invention.

In FIG. 7, the holes 21 and 22 (formed in the step shown in FIG. 6) are filled with a conducting material (plugged) to form plugged holes 23 and 24 and a second conducting layer 17 formed on the exposed surfaces of plugged holes 23 and 24 and on the surface of insulating layer 15. This process will be described in more detail with reference to FIGS. 10a through 10f. The plugged holes 23 and 24 form conducting paths extending from the surface of substrate 10 and components fabricated on the substrate 10 and the first wiring layer 14 to the second conducting layer 17. The second conducting layer 17 can then be patterned and etched to form a second wiring layer 17 as shown in FIG. 8.

Figure 9:
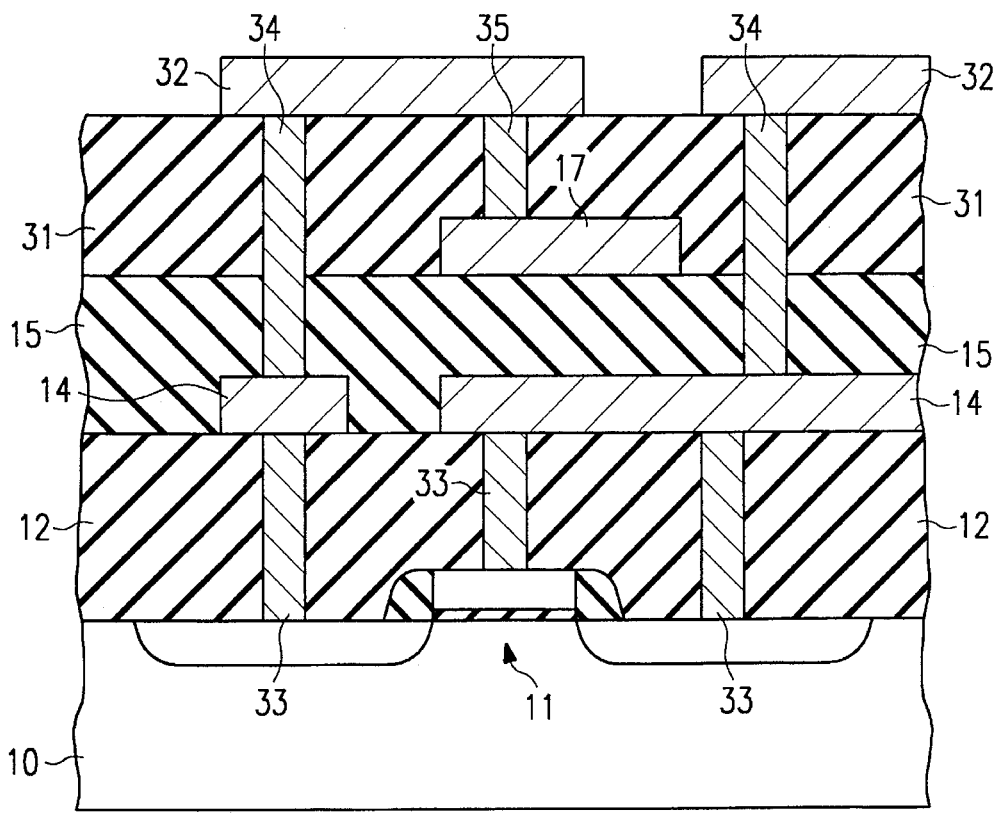
FIG. 9 is a cross-sectional view of a three-wiring layer integrated circuit fabricated in accordance with the present invention.

Referring now to FIG. 9, a process for providing a three wiring layers in an integrated circuit using the techniques of the present invention are shown. The first wiring layer 14 is electrically coupled to the surface of substrate 10 and to components 11 formed on substrate 10 by contacts 33 which go through the first insulating layer 12. This electrical coupling is provided by the techniques of the prior art. Next, the second insulating layer 15 is formed on the exposed surfaces of the first insulating layer 12 and the first wiring layer 14. A second conductive layer 17 is then formed on the second insulating layer. The second conductive layer 17 is patterned and etched to form a second wiring layer 17. A third insulating layer 31 is formed on the exposed portions of the second insulating layer 15 and the second wiring layer 17. Holes are fabricated in preestablished locations in the third insulating layer 31, a portion of the holes exposing areas on the second wiring layer 17. The remainder of the holes extend through the second insulating layer 15 and expose areas on the first wiring layer 14. A third conductive layer 32 is formed on the third insulating layer 31 and the holes are filled (i.e., plugged) with the conductive material forming the conductive layer. The holes 34, when filled with conductive material, form conductive paths from the first wiring layer 14 to the third conductive layer 32, while the holes 35, when filled with conductive material, form conductive paths from the second wiring layer 17 to the third conductive layer 32. The conductive layer 32 is then patterned and etched to form the third wiring layer 32.

Figure 10A:
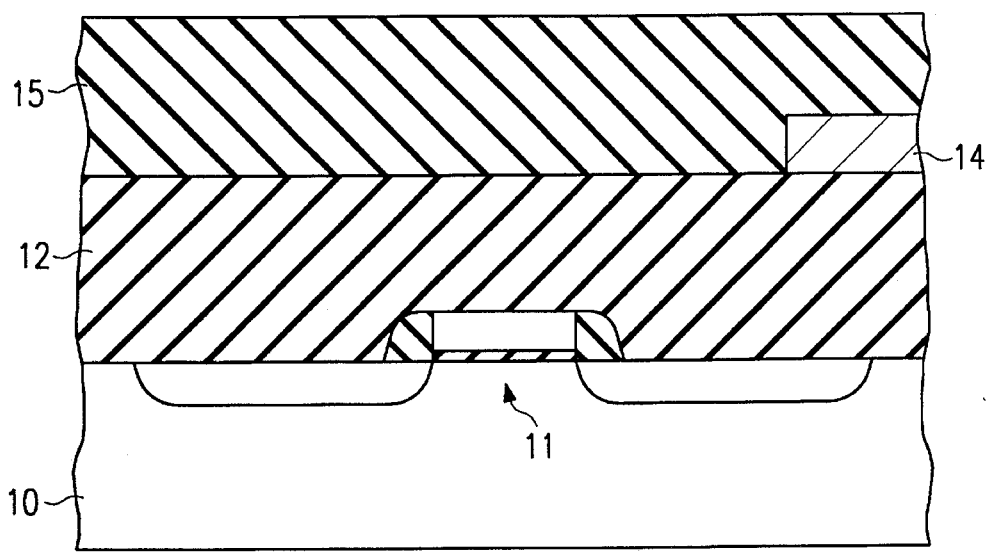
FIG. 10a is a cross-sectional view of an integrated circuit in which conducting paths interconnecting a plurality of wiring layers are to be formed concurrently in accordance with the present invention.
Figure 10B:
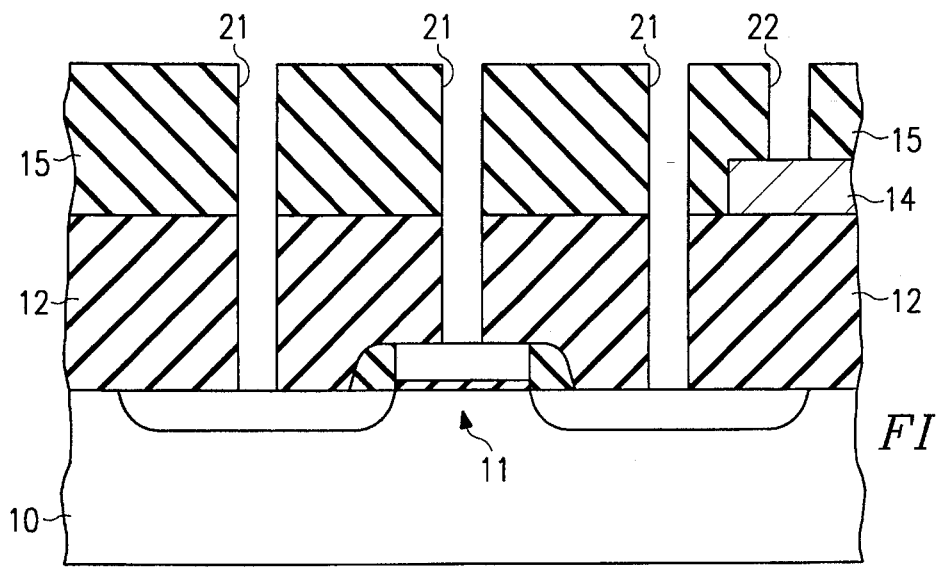
FIG. 10b is a cross-sectional view of the integrated circuit in which holes have been formed in the f.
Figure 10C:
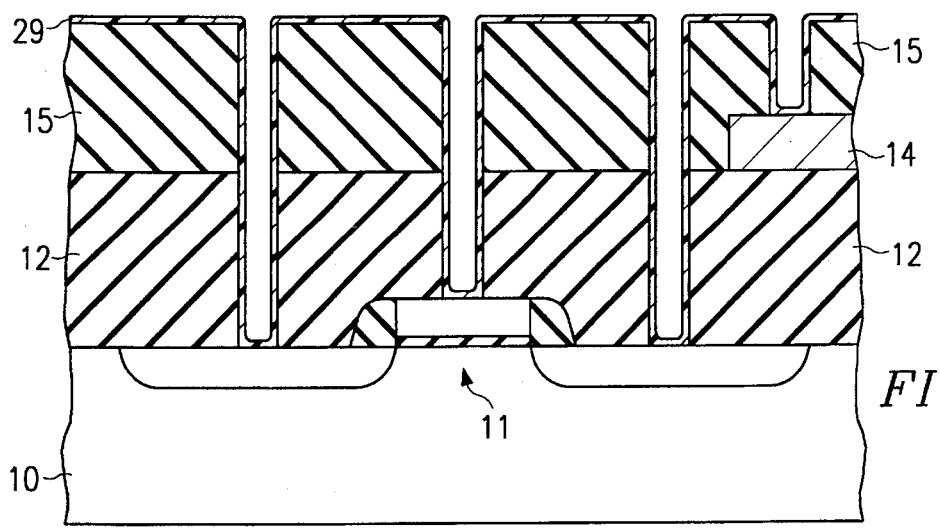
FIG. 10c is a cross-sectional view of the integrated circuit with a coating applied to the exposed surfaces.
Figure 10D:
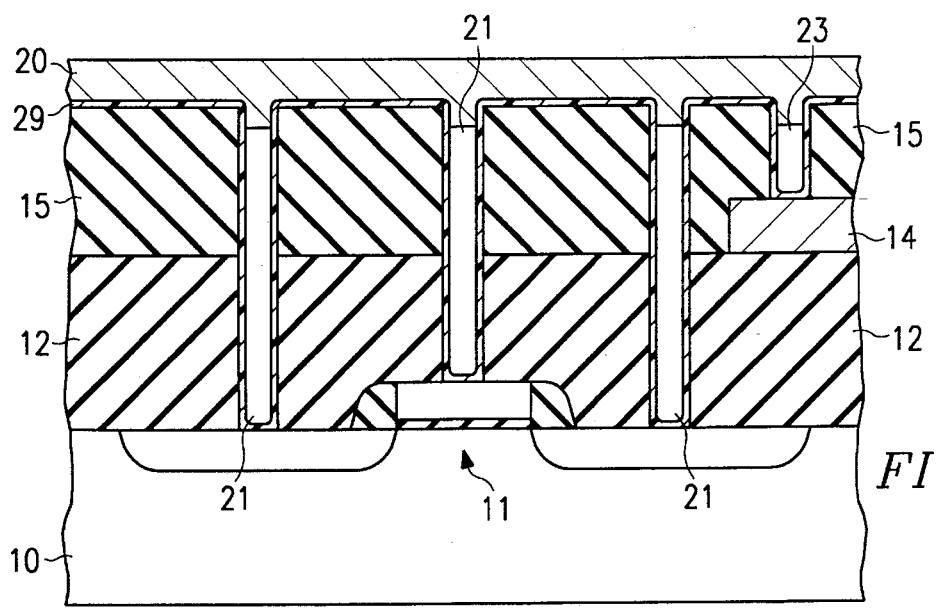
FIG. 10d is a cross-sectional view of the integrated circuit with a conducting layer applied to the surface.
Figure 10E:
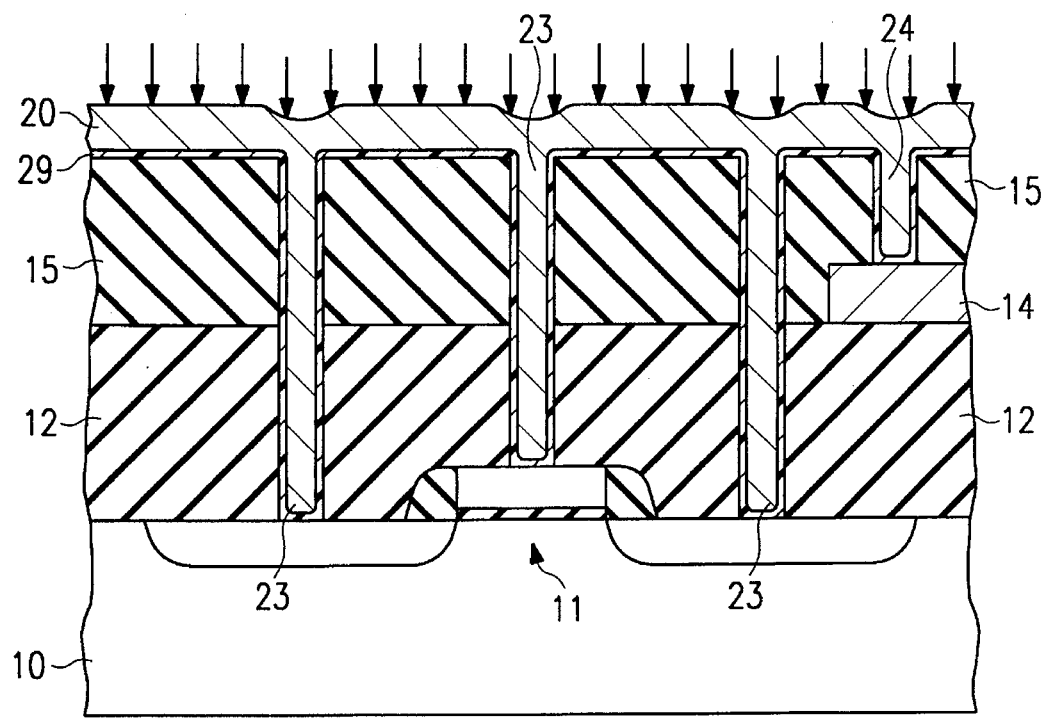
FIG. 10e is a cross-sectional view of the integrated circuit to which pressure has been applied.
Figure 10F:
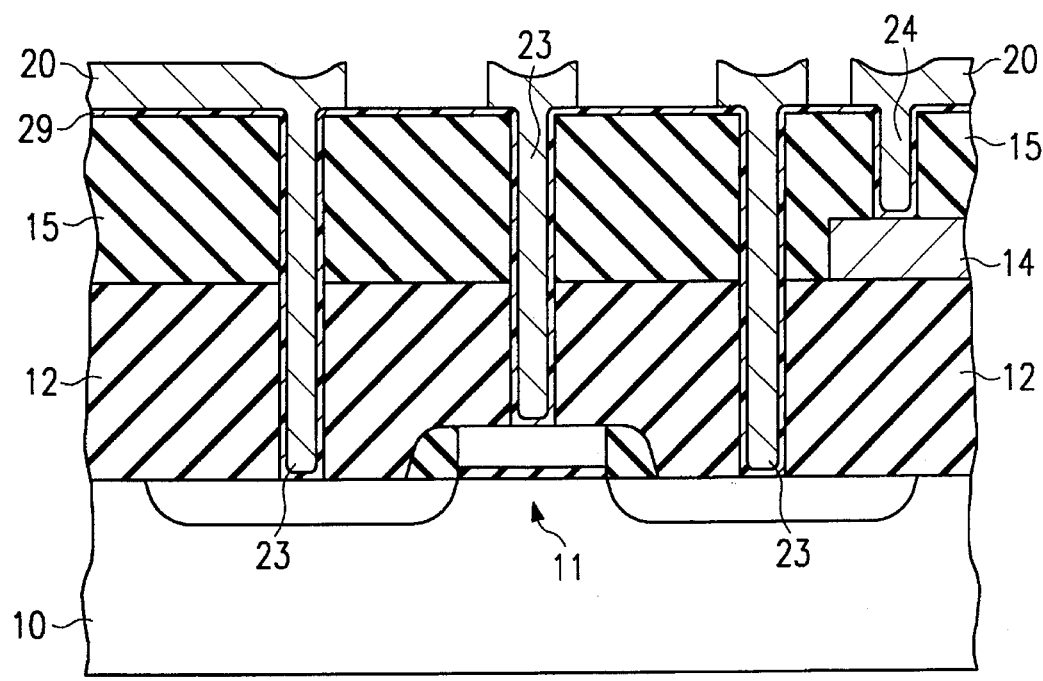
FIG. 10f is cross-sectional view of the integrated circuit after the most recently formed conducting layer has been patterned and etched to form a wiring layer.

Referring to FIGS. 10a through 10f, the process for fabricating plugged holes which can interconnect conductive regions on three separate layers of a semiconductor device is illustrated. FIG. 10a shows a cross-sectional view of a substrate 10 having a component 11 fabricated thereon wherein a first insulating layer 12, a first wiring layer 14, and a second insulating layer 15 have been formed in a manner similar to FIG. 5. In FIG. 10b, holes 21 and 22 are formed in the second insulating layer 15, a portion of the holes 22 exposing the first wiring layer 14. The remainder of the holes 21 extend through the first insulating layer 12, exposing areas on the substrate 10 and the components 11 fabricated on the substrate 10. A (conductive) barrier layer 29 is formed on the exposed surfaces of the second conductive layer 15, the first conductive layer 12, the substrate 10 and components 11 fabricated on the substrate 10, and the first wiring layer 14 as indicated in FIG. 10c. In FIG. 10d, a conductive layer 20 is formed on the surface of the barrier layer 29. The conductive material of conducting layer 20 will typically not extend to the bottom of the holes 21 and 22. In FIG. 10e, pressure is applied to the exposed surface of conductive layer 20, the pressure forcing the conductive material of conductive layer 20 to fill the holes 21 and 23. In FIG. 10f, the conductive layer 20 is patterned and etched to form the second wiring layer 20.

2. Operation of the Preferred Embodiment(s)

The present invention permits the reduction in the number of patterning and etching steps by forming conductive paths through two consecutive insulating layer at the same time, rather than patterning and etching the holes in each insulating layer separately. In the related art, the conducting through both a first and a second insulating region must be a conductive region in the wiring layer between the first and the second wiring layer. A reduction in the patterning and etching steps, which results in the fabrication of holes in the insulating layers, results in faster fabrication of the integrated circuit device.

As mentioned previously, the high aspect ratio of the holes results in difficulty in the filling of the holes with metal. Similarly, the formation of a barrier layer (i.e., layer 29 in FIG. 10c) must address the same problem. One procedure for overcoming the difficulties associated with the barrier layer formation is similar to the procedure for fabrication of a clad moat. That is, the silicide is formed on the substrate prior to the formation of the first insulating layer.

The process for forming the electrical interconnections between two wiring layers and a semiconductor substrate, according to the present invention, requires the following steps:

Forming a first metal inter-level oxide insulating layer on the substrate

Depositing the first metal wiring conductive layer

Patterning the first metal wiring conductive layer

Etching the first metal wiring conductive layer to form a first wiring layer

Forming a second metal inter-level oxide insulating layer

Patterning holes on the second insulating layer

Etching the holes in the first and the second insulating layers

Depositing a second conductive layer

Forcing the conductive material of the second conductive layer into the holes to form plugs Patterning the second conductive layer Etching the second conductive layer to form a second wiring layer The forcing the conductive material step is required because of the high aspect ratio (i.e., the ratio of depth of the hole to the width) of the holes passing through more than one insulating layer. This high aspect ratio results in difficulty in providing a column of conductive material without voids. The present invention provides a more complete filling of the high aspect ratio holes. This is accomplished, according to the preferred embodiment, by first forming a layer of conductive material over the surface of the most recently formed insulating layer and over the holes fabricated in the most recently formed insulating layer in a vacuum (i.e., at a pressure below atmospheric pressure). The conductive material is heated to a temperature where deformation under pressure can occur. An inert gas is entered, under pressure, into the system. The pressure from the gas causes a deformation in the conductive layer forcing the conductive material into the holes. Typical conditions include a temperature in the range of 350° C. to 450° C. with an inert gas pressure of 4 MPa to 8 MPa.

While the invention has been described with particular reference to the preferred embodiment, it will be understood by those skilled in the art that various changes may be made and equivalents substituted for elements of the preferred embodiment without departing from the invention. For example, the technique of providing conductive paths between two wiring layers and a third wiring layer, while fabricating the holes for both layers concurrently, can be performed with any three consecutive layers in a multi-wiring layer board. The concept can be extended, for certain interconnection patterns, to more than three layers having conducting regions thereon. Because of the higher aspect ratio, application of the present invention to more than three layers results in greater difficulty in forming plugs in the holes. In addition, many modifications may be made to adapt a particular situation and material to a teaching of the present invention without departing from the essential teaching of the present invention.

As is evident from the foregoing discussion, certain aspects of the invention are not limited to the particular details of the examples illustrated, and it is therefore contemplated that the claims shall cover all modifications and applications as do not depart from the spirit and scope of the invention.

What is claimed is:

1. A method for making electrical interconnections between a multiplicity of conductive layers in an integrated circuit, said method comprising the steps of:

forming a first insulating layer over an initial conductive layer;

forming a first wiring layer over said first insulating layer;

forming a second insulating layer over said first insulating layer and said first wiring layer;

patterning said second insulating layer;

etching holes in said first and second insulating layers;

depositing a conductive layer of conductive material over said second insulating layer and said holes; and forcing said conductive material into said holes to form a conductive plug for each hole.

2. The method of claim 1 further comprising the step of patterning and etching said conductive layer to form a second wiring layer.

3. The method of claim 2 wherein said forming a first wiring layer includes the steps of:

forming a conductive layer over said first insulating layer; and patterning and etching said first conductive layer to form said first wiring layer.

4. The method of claim 1 wherein said forcing step includes the steps of:

performing said depositing a conductive layer step under a pressure below atmospheric pressure;

heating said conductive layer to a temperature wherein said conductive material is deformable under a preselected pressure; and applying said preselected pressure to said conductive layer.

5. The method of claim 4 further including the steps of:

heating said conductive layer to a temperature of 350° C. to 450° C.; and applying a pressure of 4 MPa to 8 MPa.

6. The method of claim 1 further including the step of implementing said initial conductive layer with a substrate components fabricated thereon.

7. The method of claim 1 further including the step of implementing said initial conductive layer with a wiring layer.

8. A method of filling holes in an integrated circuit with a conducting material, selected ones of said holes extending through a first insulating layer and a second insulating layer to expose conducting regions of a base layer, other holes extending through said first insulating layer to expose conducting regions of a first wiring layer between said first and said second insulating regions, said integrated circuit having a plurality of wiring layers; said method comprising the steps of:

applying a conductive layer of conductive material over an exposed surface of said second insulating layer, said conductive layer covering said holes; and forcing said conductive material into said holes.

9. The method of claim 8 wherein said forcing step includes the steps of: